United States Patent
Henrion et al.

(10) Patent No.: US 7,856,576 B2
(45) Date of Patent: Dec. 21, 2010

(54) METHOD AND SYSTEM FOR MANAGING MEMORY TRANSACTIONS FOR MEMORY REPAIR

(75) Inventors: Carson D. Henrion, Ft. Collins, CO (US); Dan Robinson, Richardson, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 883 days.

(21) Appl. No.: 11/789,683

(22) Filed: Apr. 25, 2007

(65) Prior Publication Data

US 2008/0270703 A1 Oct. 30, 2008

(51) Int. Cl.
*G06F 11/00* (2006.01)
(52) U.S. Cl. ............................ 714/42; 711/128; 711/136
(58) Field of Classification Search ................. 711/128, 711/136; 714/42
See application file for complete search history.

(56) References Cited

U.S. PATENT DOCUMENTS

| | | | | |
|---|---|---|---|---|
| 4,996,641 A * | 2/1991 | Talgam et al. ................ | 711/118 |
| 5,019,971 A * | 5/1991 | Lefsky et al. .................... | 714/5 |
| 5,070,502 A * | 12/1991 | Supnik ............................ | 714/8 |
| 5,551,004 A * | 8/1996 | McClure ...................... | 711/138 |
| 5,666,482 A * | 9/1997 | McClure ......................... | 714/8 |
| 5,708,789 A | 1/1998 | McClure | |
| 6,006,311 A * | 12/1999 | Arimilli et al. ............... | 711/133 |
| 6,044,441 A * | 3/2000 | Malinowski ................. | 711/144 |
| 6,385,071 B1 * | 5/2002 | Chai et al. .................. | 365/49.1 |
| 6,412,051 B1 * | 6/2002 | Konigsburg et al. ......... | 711/163 |
| 6,567,952 B1 * | 5/2003 | Quach et al. ................. | 714/800 |
| 6,754,117 B2 | 6/2004 | Jeddeloh | |
| 6,870,782 B2 | 3/2005 | Wu et al. | |
| 6,918,071 B2 * | 7/2005 | Cherabuddi et al. ......... | 714/710 |
| 6,928,591 B2 | 8/2005 | Grinchuk et al. | |
| 7,053,470 B1 | 5/2006 | Sellers et al. | |
| 7,137,027 B2 | 11/2006 | Shiota et al. | |
| 7,170,802 B2 | 1/2007 | Cernea et al. | |
| 7,370,151 B2 * | 5/2008 | Asher et al. .................. | 711/128 |
| 7,376,868 B2 * | 5/2008 | Yoshizawa et al. ............ | 714/42 |
| 2002/0124145 A1 * | 9/2002 | Arimilli et al. ............... | 711/146 |
| 2003/0088811 A1 * | 5/2003 | Cherabuddi et al. ........... | 714/42 |
| 2004/0078702 A1 * | 4/2004 | Yoshizawa et al. ............ | 714/42 |
| 2005/0273669 A1 * | 12/2005 | DeSota ........................ | 714/42 |

* cited by examiner

*Primary Examiner*—Yolanda L Wilson

(57) ABSTRACT

In one embodiment, a controller for an associative memory having n ways contains circuitry for sending a request to search an indexed location in each of the n ways for a tag, wherein the tag and an index that is used to denote the indexed location form a memory address. The controller also contains circuitry, responsive to the request, for sending a set of n validity values, each validity value indicating, for a respective way, whether the indexed location is a valid location or a defective location. Additionally, the controller contains circuitry for receiving a hit signal that indicates whether a match to the tag was found at any of the indexed locations, wherein no hit is ever received for a defective location.

20 Claims, 6 Drawing Sheets

METHOD AND SYSTEM FOR MANAGING MEMORY TRANSACTIONS FOR MEMORY REPAIR

BACKGROUND

Prior to the use of a chip containing a memory array, each address in the array is tested to detect manufacturing defects that prevent the address from correctly storing information. Rather than discard a memory array chip that contains defects, considerable effort is expended to "repair" the defect(s) by logically replacing a defective row or column with another row or column that has been designated as a spare. Replacement logic ensures that references to the original row or column are routed to the replacement row or column.

The implementation of memory array repair typically requires extensive custom circuit design and introduces additional constraints on the main array. Additionally, the circuits to detect an access to a defective address and to multiplex the repaired memory elements into the array reduce the maximum operating frequency of the array. In most implementations, chip geography places further limitations on the repair elements, requiring that they be physically close to the defect.

A given repair element, or even a group of repair elements, can't repair every type of defect mechanism. For example, a cluster of failures in one physical area typically can't be repaired. Although necessary, the redundant array elements used for repairing defects, as well as their supporting circuits, can consume a significant fraction of the total array area and are frequently not used.

DETAILED DESCRIPTION OF THE DRAWINGS

Figure 1:
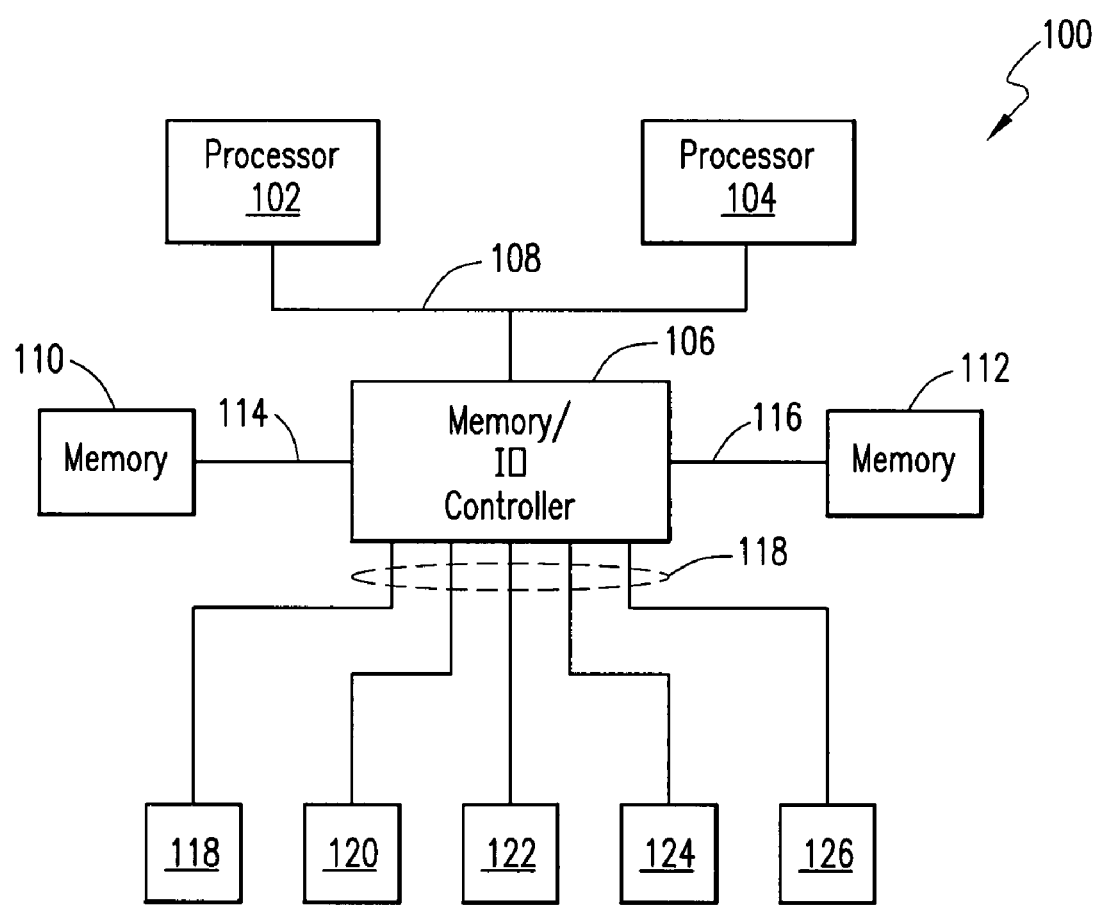
FIG. 1 illustrates an exemplary computer system containing a cache controller in accordance with an embodiment of the present disclosure.

Representative embodiments of the present patent disclosure will now be described with reference to various examples wherein like reference numerals are used throughout the description and several views of the drawings to indicate like or corresponding parts, and further wherein the various elements are not necessarily drawn to scale.

With reference to FIG. 1, a computer system that uses a cache controller according to an embodiment of the present disclosure is illustrated and generally designated 100. System 100 contains one or more processors, e.g., 102, 104, which are connected to memory and I/O controller 106 through system bus 108. One or more memory modules, e.g., 110, 112 are connected to memory and I/O controller 106 by memory buses 114, 116. I/O bus 118 connects memory and I/O controller 106 to device adapters 120, 122, 124, 126, 128. Each of device adapters 120, 122, 124, 126, 128 provides a connection for a peripheral component bus, allowing connections to multiple peripheral components, which are not specifically shown. The specific embodiment shown is provided for the purpose of discussion and should not be taken to limit the disclosure in any manner.

The memory controller and method will be described in relation to set associative memory and an overview of the use of a set associative memory is provided here for illustration; however, it should be understood that the embodiments are not limited to set associative memory. To understand the concept of set associative memory, it is helpful to look first at some of the exemplary methods of controlling cache memory. Whenever the data from a specific memory address is requested by a processor, the memory controller must determine whether the desired information is available within the cache or must be retrieved from main memory. Commonly, when data from main memory is stored in the cache, the main memory address is also stored in cache memory. Then, when a processor requests a given memory address, the cache is searched for the desired address. If the address is found in the cache, the data is also there; otherwise, the data must be read from the main memory address. The challenge is to provide a fast, but not prohibitively expensive, means for searching the cache.

Fully associative mapping requires that the searchable memory addresses be stored in a type of memory called content addressable memory. A content addressable memory searches all of the locations simultaneously for the presence of the desired address, so the search is conducted quickly. However, a simultaneous search of the entire cache requires a comparator for every location in the memory, making this type of memory very expensive.

Figure 2:
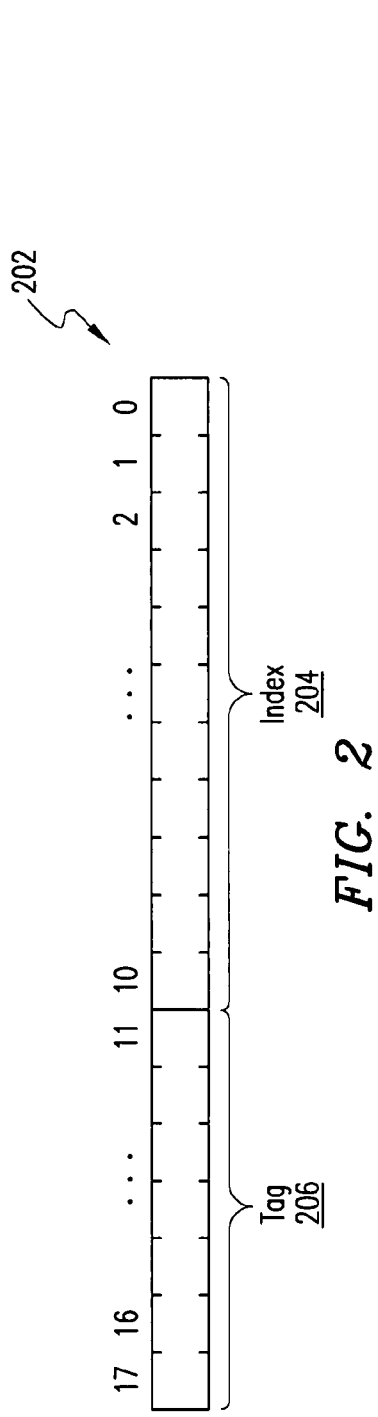
FIG. 2 illustrates a memory address divided into tag and index.

Direct mapping is a less expensive method of implementing a cache. In direct mapping, each location in main memory can be stored in the cache at a single location, although numerous main memory addresses are mapped to each location in the cache. In implementation, a portion of the main memory address, called the tag, is stored in the cache, at a location corresponding to a second portion of the address, called the index. With reference to FIG. 2, exemplary main memory address 202 is eighteen bits long. Index 204 consists of bits 0-10 and tag 206 consists of bits 11-17 of memory address 202. The value of index 204 determines the single location within the cache at which memory address 202 may be stored. To identify which of the possible main memory addresses are stored at this location in the cache, tag 206 is stored at a location determined by index 204. Then, when the processor makes a request for a specific main memory address, only the single location specified by the corresponding index 204 is checked to determine if the desired tag is present. Although direct mapping does not require expensive hardware, this technique can result in situations in which a cache location is frequently swapped out. This problem can occur, for example, when a data array and the logic to access the data array are stored at locations having similar indexes.

Set associative memory provides a scheme that falls between a fully associative memory and a direct mapped memory. A set associative memory allows a given location in main memory to be stored in a small number of cache locations. An associative cache that has n ways has n possible locations at which the information from a given memory location can be stored. The most common values of n are 2, 4 or 8, although other integer values can also be used.

Figure 3:
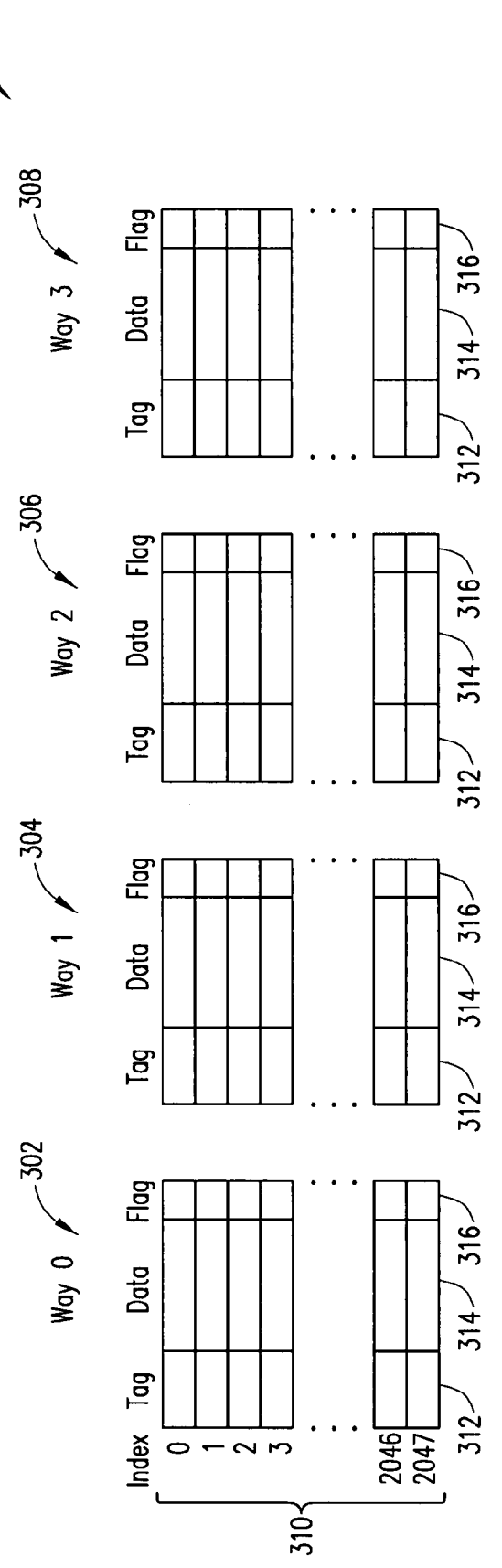
FIG. 3 illustrates a four-way cache that is controlled by a memory controller according to an illustrative embodiment of the present disclosure.

With reference to FIG. 3, an associative memory that can be managed using a memory controller and method according to the present disclosure is described. In the illustrative embodiment, associative memory 300 is a four-way memory having ways 302, 304, 306, 308. Within each of ways 302, 304, 306, 308 are locations 310 associated with each possible index. Assuming for illustration that the processor uses the 18-bit address shown in FIG. 2, each of ways 302, 304, 306, 308 has 2048 storage locations, corresponding to the 2048 possible values for the index. For each location in the cache, storage for three items of information is shown: (1) tag 312 corresponding to the main memory address stored at that location, (2) data 314 associated with the main memory address and (3) flag 316 indicating whether the data at that location is valid or stale. For reasons of cost in actual implementations, tag 312 and flag 316 are often stored in the searchable way, while data 314 is stored at a separate location associated with the specific way and index, often in a slower, cheaper type of memory.

When a processor requests a given memory address 202, the controller simultaneously searches for desired tag 206 at the location 310, in each of ways 302, 304, 306, 308, which corresponds to index 204. If tag 206 is found in one of ways 302, 304, 306, 308, the corresponding data is provided to the system. If tag 206 is not present in any of ways 302, 304, 306, 308, the data will be retrieved from main memory and stored at the indexed location in one of ways 302, 304, 306, 308. The memory controller determines which way of ways 302, 304, 306, 308 is allocated according to a desired replacement algorithm.

The memory controller and method disclosed herein can advantageously manage a memory, such as associative memory 300, using logic to avoid the use of defective locations. In one embodiment, the disclosed method can be used to avoid row repair. In one embodiment, column and/or row repair can be performed on the memory and the disclosed method may be used to address issues that cannot be repaired with either column or row repair, such as clustered failures. Alternatively or additionally, the disclosed method may be used to address any combination of these sources of failure for the memory. In an exemplary embodiment, column repair is performed on associative memory 300, but row repair is not performed. In this exemplary embodiment, if a given row in one of the ways is found to be defective, the cache loses one way of the n possible ways available, i.e., no data will be stored at the defective location. Exemplary four-way cache 300 becomes a three-way cache for the affected index. At other, valid index locations however, memory 300 remains a four-way associative memory with four possible storage locations. Although an embodiment is illustrated with reference to a set associative memory, the disclosed method and memory controller are not limited to set associative memory, but can also be adapted for use in fully associative memory and other types of memory.

Figure 4:
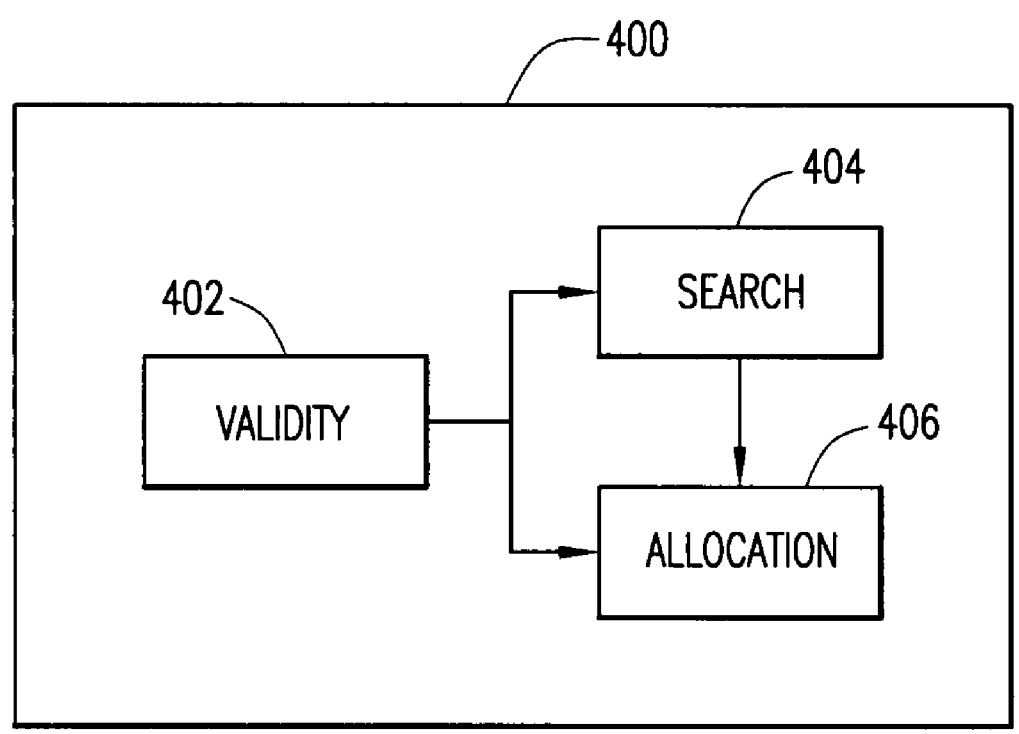
FIG. 4 illustrates a memory controller and memory logic blocks used in implementing a memory controller according to an embodiment.

At a conceptual level, once a defective location in the memory is identified, two events should be prevented: (a) writing to the defective location and (b) relying on data from the defective location. Referring now to FIG. 4, a block diagram of a memory controller according to an exemplary embodiment is illustrated and generally designated 400. Memory controller 400 contains validity module 402, search module 404 and allocation module 406.

Search module 404 searches for a given memory address to determine whether the memory address is stored in the cache memory. Search module 404 advantageously recognizes defective locations in the memory and ignores the information that is stored in the defective locations. Allocation module 406 allocates the storage location in the cache memory that will be used whenever new information is stored. Allocation module 406 also recognizes defective locations and blocks the allocation of any defective locations. In order for search module 404 and allocation module 406 to perform their respective tasks, validity module 402 provides validity values that enable the recognition of defective locations in the cache memory. These three modules represent capabilities of the controller; specific implementations of a controller according to the present embodiment can accomplish these capabilities using many different methods and modules.

Figure 5:
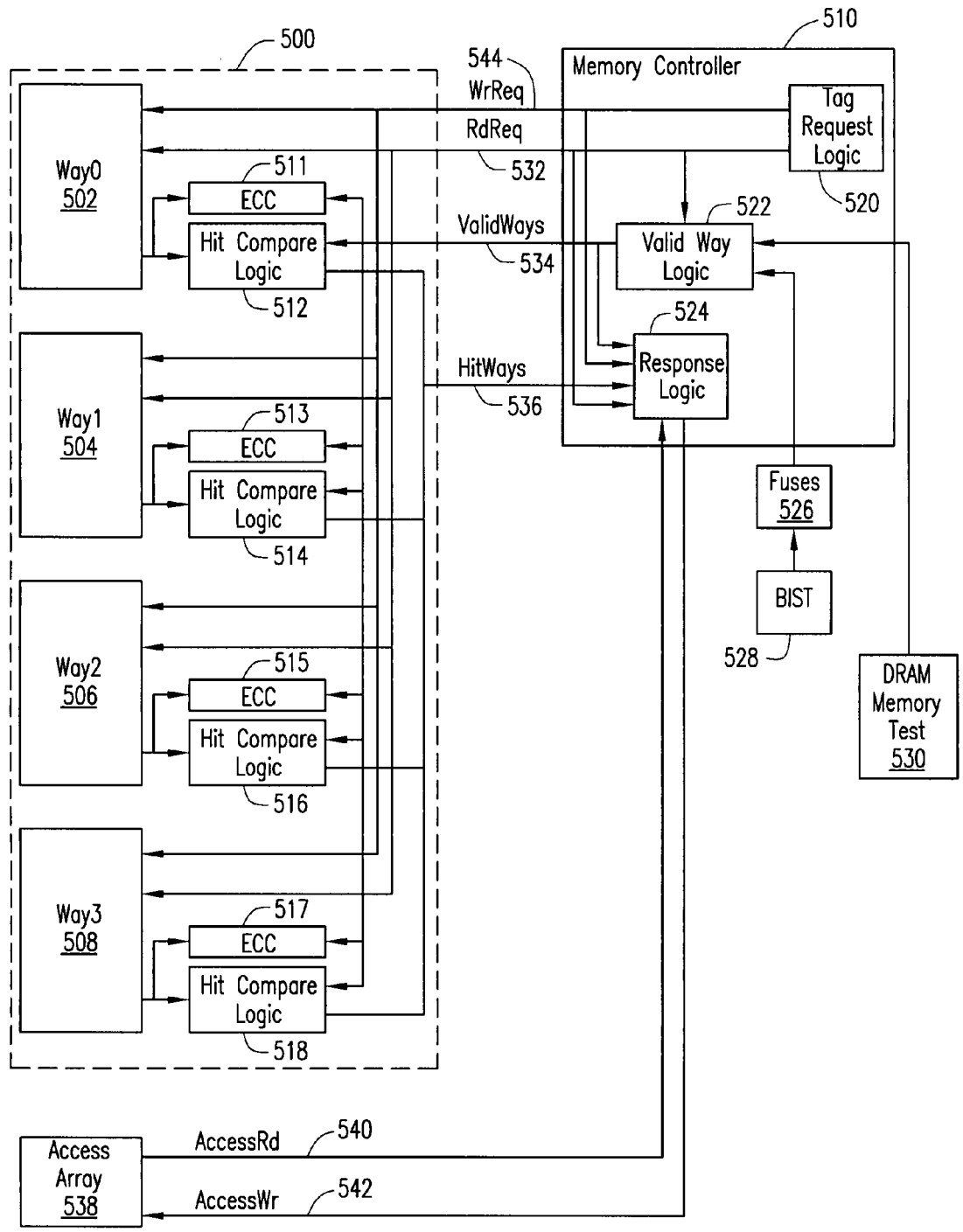
FIG. 5 illustrates a high-level block diagram of a circuit containing a set associative cache and cache controller according to an embodiment.

With reference now to FIG. 5, a 4-way associative memory block 500 and memory controller 510 are disclosed according to an embodiment. In one embodiment, memory block 500 is an L4 cache in a multiprocessor environment. Memory block 500 is a 4-way associative memory that includes ways 502, 504, 506, 508. In the present embodiment, ways 502, 504, 506, 508 are static random access memory (SRAM) blocks and provide storage for a tag and a valid flag for each index location. Data storage corresponding to ways 502, 504, 506, 508 is in a separate memory composed of dynamic random access memory (DRAM) on a separate chip and is not shown. Each of ways 502, 504, 506, 508 is connected to respective hit compare logic blocks 512, 514, 516, 518 and to respective error correction code (ECC) blocks 511, 513, 515, 517. When a request is made to locate a specific main memory address, hit compare logic blocks 512, 514, 516, 518 receives the content of the indexed location and compares the content to the requested tag. In other words, the hit compare logic blocks 512, 514, 516, 518 search the ways for a match to a requested tag. The output from the hit compare logic block is an indication of 'hit' or 'no hit' for each way. ECC 511, 513, 515, 517 contains circuitry for testing the accuracy of the data as the data is read or written. Recoverable errors are corrected by the ECC. Most errors detected by the ECC are soft errors, generally from radiation events; once the memory location is re-written, this type of failure will not return. When a failure persists at one location, the failure is most likely a hard error, e.g., caused by degradation of a transistor. In one embodiment, when the ECC detects a persistent failure at a location, that location is reported to the valid way logic, which ensures that the location of the persistent failure is marked as a defective address.

Memory controller 510 contains tag request logic block 520, valid way logic block 522, and response logic block 524. Tag request logic block 520 receives requests from a processor for memory addresses. Using the memory address as a tag and index, tag request logic block 520 sends a request to search the indexed location in each of the ways of the associative memory for the requested tag. The tag and index from the search request are also sent to other modules as necessary. In response to the request, valid way logic block 522 produces, for the indexed location in each way, a validity value that indicates whether the location is a valid location or a defective location. The index that is used to access the ways is also used to retrieve valid way information. Response logic block 524 receives a signal that indicates whether a match to the tag was found at any of the indexed locations and manages a response. When the hit signal indicates no matches, a new tag is written to memory block 500; response logic block 524 allocates a location in one of the ways to be used for storage of the new tag.

Memory controller 510 receives input from both fuses 526 and DRAM memory test 530. Built-in self test (BIST) block 528 tests ways 502, 504, 506, 508 to determine whether any locations in SRAM memory block 500 are defective. Defective locations in the ways are permanently stored in fuses 526 and can be loaded into valid way logic block 522 at system start-up. In one embodiment, the disclosed method can be used to avoid a range of addresses that contain defects. For example, clusters of failures can occur along the physical boundary of an array due to lithography issues, giving rise to defects in adjacent addresses. The issue can be addressed in the disclosed method by storing an extra bit in the fuse that allows the address compare circuit to match a one or a zero for that bit of the address. DRAM memory test 530 tests the DRAM memory in which the associated data is stored. DRAM memory test 530 writes to each location in the DRAM and then reads the information back to ensure that the memory is working properly. Any errors are noted. As discussed above with reference to the SRAM testing, a range of addresses having defects can also be noted. The result of the DRAM testing is also input to valid way logic block 522. In one embodiment, valid way logic block 522 may combine the information from fuses 526 and DRAM memory test 530 in order to know all locations in either memory that are defective. This combined information may then be used to identify valid or defective locations to other modules as necessary. Although combining the knowledge of defects in SRAM memory block 500 with knowledge of defects in the DRAM memory is not necessary to the practice of the embodiments of the present disclosure, this feature provides further benefit to the use of the disclosed method and memory controller embodiment.

Continuing to refer to FIG. 5, access array 538 contains an indicator or access value for each location in the ways, accessed by the same index as their corresponding ways. Response logic block 524 updates these indicators after each access in order to track hits and writes to ways 502, 504, 506, 508. The specific method of updating the access values reflects the algorithm used to allocate space in the cache. One embodiment uses the "not recently used" (NRU) allocation algorithm, although one skilled in the art would know that other algorithms can also be used in the present context without affecting the disclosed method and system. The access values in access array 538 are grouped together so that each possible index is represented by a four-bit set of access values. These access values are set to zero at system start-up, except for defective locations, which are marked with a one. Each time that an indexed location in a given way receives a hit or is written to, the associated access value is set to one, indicating recent use. If a current change would result in all ones for that 4-bit set of access values, the set of access values is first cleared to all zeros, then the current change is made. This algorithm ensures that for a given indexed location, all four ways will be written before any data is overwritten, assuming that no locations are defective.

To avoid allocation of a defective location, whenever an access value is written to access array 538, response logic block 524 determines whether any of the indexed locations are defective. If a location is defective, response logic block 524 marks the associated access value to reflect recent use. If the current action would fill the entire set of access values with 1's, response logic clears the set of access values to 0's, then stores a one for the currently affected location and for any defective location. As a result, a defective location will never be chosen during the allocation process, since the access value will always indicate recent use.

Still referring to FIG. 5, the signals that are sent between modules are discussed. Tag request logic block 520 in memory controller 510 sends two signals: read request, RdReq, 532 and write request, WrReq, 544. RdReq 532 contains a requested memory address including an index and a tag and is sent to ways 502, 504, 506, 508, valid way logic block 522, and response logic block 524. WrReq 544 is sent to ways 502, 504, 506, 508 and to response logic block 524. Valid way logic block 522 receives RdReq 532 and uses the included index to create indicator ValidWay 534, which indicates, for each of the indexed location, whether the location is defective or not. Valid way logic block 522 sends indicator ValidWay 534 to hit compare logic blocks 512, 514, 516, 518, error correction code 511, 513, 515, 517, and response logic block 524. In each of the receiving modules, ValidWay 534 is used to ensure that defective locations are not relied on for reading or writing. During a read of associative memory 500, the contents of the indexed location in each of ways 502, 504, 506, 508 is sent to respective hit compare logic blocks 512, 514, 516, 518, where the content is compared to the requested tag. The hit compare logic block receives ValidWays 534, which is used to ignore any possible hits when the location is defective. Hit compare logic blocks 512, 514, 516, 518 forwards the result of all the compares, HitWays 536, to response logic block 524. During a read from a defective location in a way, the associated error correction code 511, 513, 515, 517 would normally report an error. However, ECC 511, 513, 515, 517 receives ValidWays 534 and uses this indicator to avoid reporting errors at known defective locations. Finally, response logic block 524 reads from access array 538 using AccessRd 540 and writes to access array 538 using AccessWr 542.

Figure 6:
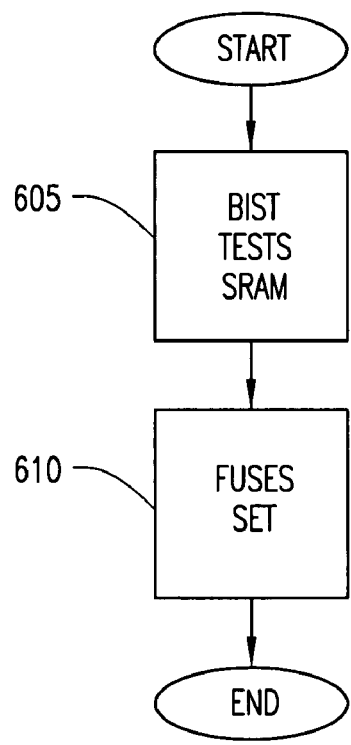
FIG. 6 illustrates a scheme for initial testing of a set associative cache according to an embodiment.

With reference now to FIG. 6, a scheme for testing the SRAM memory in one embodiment is disclosed. A memory array, e.g., the memory array 500 comprising ways 502, 504, 506, 508 is tested for defects by built-in self test (BIST) 528 (block 605). During this testing BIST 528 repairs defective columns using known methods. BIST 538 does not repair defective rows, but stores the location of any defective rows in fuses 526, which provides a permanent memory of the discovered defects (block 610). This information is later sent to memory controller 510 according to an embodiment of the disclosure.

Figure 7:
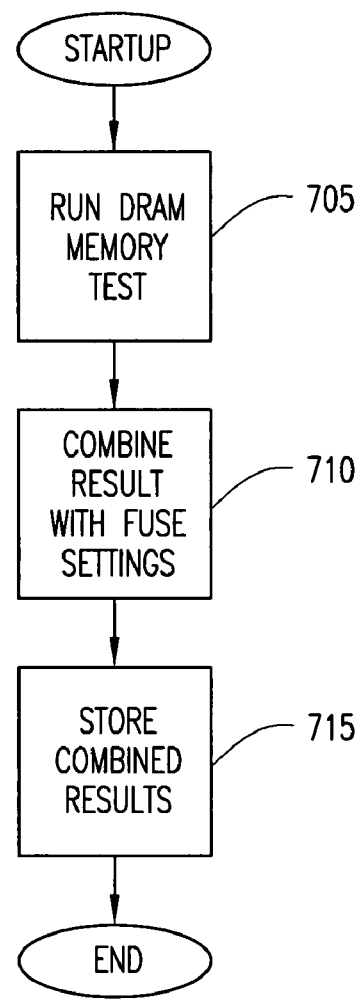
FIG. 7 illustrates a scheme for combining the testing of two related memories in an embodiment.

As mentioned previously, the cache is frequently divided into a faster memory, e.g., SRAM, containing the tags and the associated flags that indicate if the data is valid or stale, and a slower memory, e.g., DRAM, that contains the actual data. The disclosed method can be used to avoid the defects in both of these memories at the same time. With reference now to FIG. 7, one embodiment is disclosed for loading defective addresses, including errors in the DRAM, into valid way logic block 522. At system start-up, a memory test is executed to test for errors in the DRAM array in which the cache data is stored (block 705). The information in fuses 526 is then combined with the result of DRAM memory test 530 (block 710). This combined information is stored in valid way logic block 522 (block 715) and provides a database of all known errors in the cache memory.

Figure 8:
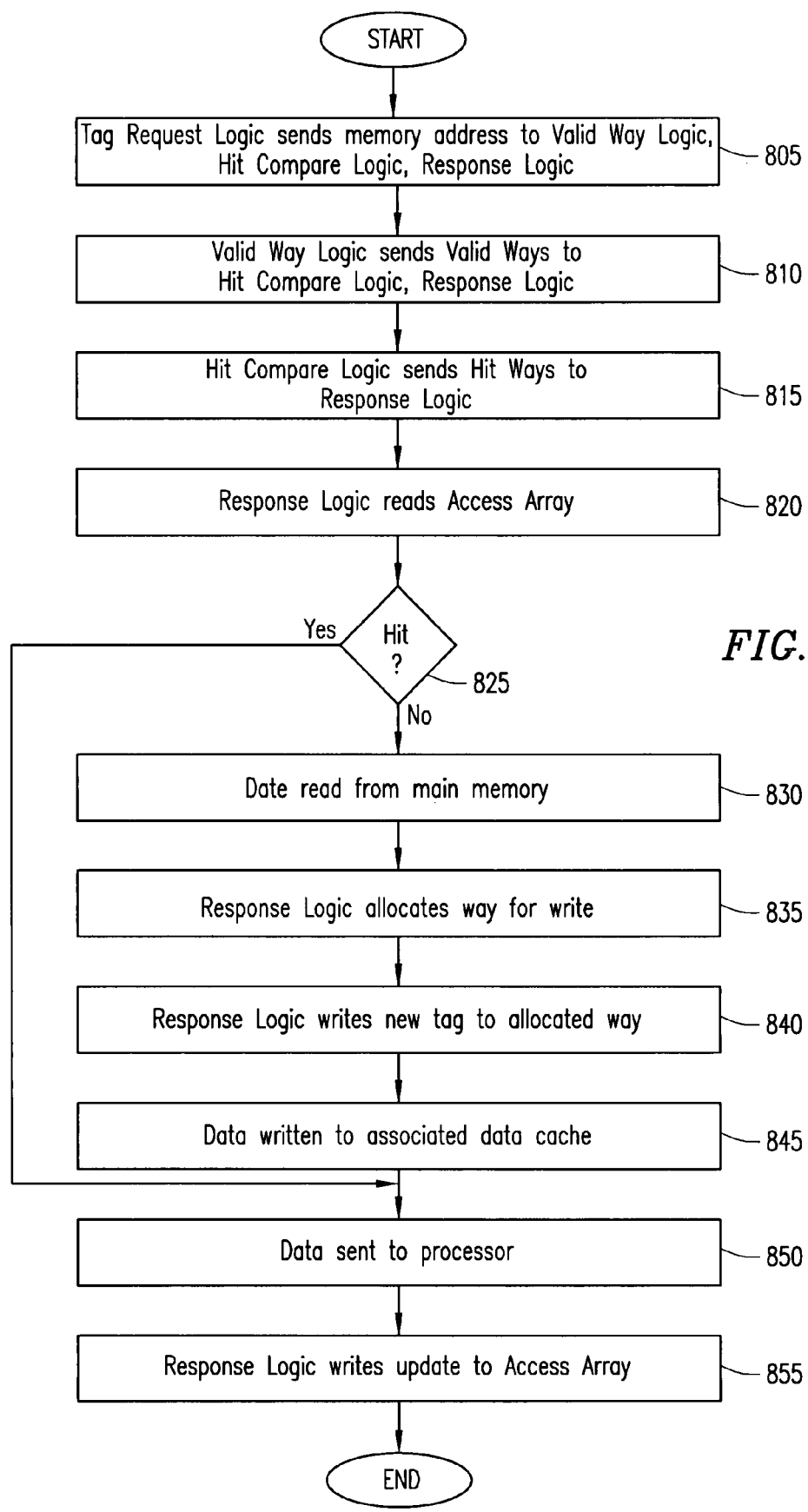
FIG. 8 illustrates a scheme for managing a cache memory according to an embodiment.

With reference now to FIG. 8, an embodiment for managing a memory such as n-way associative memory 500 is discussed. The scheme begins when a request for a given main memory address is received in a memory controller, such as memory controller 510. Tag request logic block 520 sends the requested memory address, including index and tag, to ways 502, 504, 506, 508, hit compare logic blocks 512, 514, 516, 518, and to response logic block 524 (block 805).

After receiving the request, valid way logic block 522 uses the requested index and the information received from fuses 526 and DRAM memory test 530 to determine whether any of the indexed locations contain defects or errors. This information is used to create ValidWays 534. In one embodiment, ValidWays 534 contains a bit for each way, with a "1" indicating that the location is valid for the associated way and a "0" indicating that the location contains a defect or error. ValidWays 534 is sent to hit compare logic blocks 512, 514, 516, 518, error correction code blocks 511, 513, 515, 517, and to response logic block 524 (block 810).

At each way, associated hit compare logic blocks 512, 514, 516, 518 receives the tag stored at the indexed location of the respective way 502, 504, 506, 508 and compares the received tag with the requested tag. Prior to sending the results of the compare, hit compare logic blocks 512, 514, 516, 518 performs two additional tests. In order to confirm a hit in the cache, the associated flag bit is checked to ensure that the data is valid and to prevent the use of stale data. The hit compare logic block also reads ValidWays 534 and determines whether any of the indexed locations are defective. If an indexed location is defective, the hit compare logic blocks or ignores a hit occurring on that way. Since a read of all four ways is automatically performed, the possibility exists that the value in a defective location will accidently match a requested tag; blocking the hit prevents this error from propagating through the system. In other words, a hit compare logic block reports a hit for the indexed location in the associated way if (a) the location has a match for the requested tag, (b) the valid data bit for the location is set and (c) the respective validity value indicates no defect. The combined output 536 from hit compare logic blocks 512, 514, 516, 518 is sent to response logic block 524 (block 815). Thus, use of ValidWays 534 ensures that a defective location will not give a false match. One skilled in the art would appreciate that other means for avoiding a defective location can also be implemented within the scope of the present disclosure.

After a read request is sent to the ways, response logic block 524 reads from access array 538 block 820, providing a current access history for the location. Response logic block 524 then determines from HitWays 536 whether a hit occurred in any of the ways (block 825). If a hit has occurred, response logic block 524 ensures that the corresponding data is returned to the processor in (block 850) and then updates access array 538 to reflect the hit (block 855). If no hit occurred, response logic indicates this to the controller and the data is read from main memory (block 830). Tag request logic allocates a way to be used to store a new tag (block 835). The allocation of a defective way has already been blocked when the access array is updated, as explained earlier. One skilled in the art would recognize, however, that other mechanisms can also be used to block allocation of a defective location for purposes of the present patent application. Response logic writes the new tag to the allocated location (block 840) and the associated data is written to the data cache (block 845). Finally, the new data is sent to the requesting processor (block 850) and response logic writes an update to the access array to reflect the write (block 855).

The disclosed method and memory controller provide a means to eliminate the use of row replacement to repair a defect in a memory, such as an associative memory. Defective locations are mapped and logic is incorporated into the normal access routines to avoid using the defective locations or relying on their respective content. Space for replacement rows can be used for other purposes, such as increasing the size of the primary array. While the effective number of ways is reduced at defective locations, there is minimal effect on the operation of the memory.

Based on the foregoing Detailed Description, it may be appreciated that the embodiments set forth herein provide a memory controller and method that do not perform row repair in a set associative memory in a conventional manner. Instead, the controller uses stored information about the location of known defects and neither stores information in the defective location nor uses any information read from the defective location in one embodiment.

Although the present patent disclosure has been described with reference to certain exemplary embodiments, it is to be understood that the forms of the embodiments shown and described are to be treated as illustrative only. Accordingly, various changes, substitutions and modifications can be realized without departing from the scope of the present disclosure as set forth in the following claims.

What is claimed is:

1. A controller for an associative memory having n ways, where n is a positive integer, said controller comprising:
   circuitry to send a request to search an indexed location in each of said n ways for a given tag, wherein said given tag and an index that is used to denote said indexed location form a memory address;
   circuitry, responsive to said request, to generate a set of n validity values, each validity value indicating, for a respective way, whether said indexed location is a valid location or a defective location;
   circuitry to receive a hit signal that indicates whether a match to said given tag was detected at any of said indexed locations; and
   an access array to, in response to the hit signal, characterize the indexed location associated with the hit signal and defective ones of the indexed locations as being recently used.

2. The controller according to claim 1, wherein characterizing the defective ones of the indexed locations as being recently used is to prevent the defective ones of the indexed locations from being allocated.

3. The controller according to claim 1, wherein said circuitry to send said request to search said indexed location in each of said n ways for said given tag is to send said request during a memory access request after completion of a memory test of the n ways.

4. The controller according to claim 1, wherein said controller uses a "not recently used" replacement algorithm and said characterization in said access array of said defective ones of said indexed locations as being recently used prevents said "not recently used" replacement algorithm from allocating said defective ones of said indexed locations.

5. The controller according to claim 1, further comprising circuitry to receive a result of a first test for defects in said associative memory, wherein said result is used to generate said validity values.

6. The controller according to claim 5, further comprising circuitry to receive a result of a second test for defects in a data cache associated with said associative memory, wherein said circuitry to receive said result of said second test combines said results of said first test and said results of said second test and uses said combined results to generate said validity values.

7. A computer system comprising:
   one or more processors in communication with an associative memory having n ways, where n is a positive integer, said associative memory being accessible by said one or more processors;
   means for sending a request to search an indexed location in each of said n ways for a given tag, wherein said given tag and an index that is used to denote said indexed location form a memory address;
   means for generating, responsive to said request, a set of n validity values, each validity value indicating, for a respective way, whether said indexed location is a valid location or a defective location; and means for updating a set of access values corresponding to said given index, wherein said means for updating uses said set of n validity values to characterize a defective one of said indexed locations as being recently used.

8. The computer system according to claim 7, further comprising means for searching said indexed locations for a match to said given tag, wherein said means for searching searches ones of the indexed locations characterized as defective and ones of the indexed locations not characterized as defective.

9. The computer system according to claim 7, wherein said associative memory contains respective means for correcting errors for each way, wherein said means for correcting errors uses a respective validity value to block a report of an error for said defective one of said indexed locations.

10. The computer system according to claim 9, wherein when said means for correcting errors detects a persistent error, said means for correcting errors identifies a location of the persistent error to said means for sending said set of n validity values.

11. The computer system according to claim 7, further comprising non-volatile storage containing a result of a first test for defects in said associative memory.

12. The computer system according to claim 11, further comprising means for combining said result of said first test with an output from a second test of a data memory associated with said associative memory to form combined results, wherein said combined results are used to produce said set of n validity values.

13. The computer system according to claim 11, wherein said non-volatile storage contains means to store a range of addresses associated with defective ones of said indexed locations.

14. The computer system according to claim 7, further comprising means for searching to report a hit for a given way if (a) one of said indexed locations has a match for said tag, (b) a valid data bit for said one of said indexed locations location is set or (c) said validity value indicates no defect.

15. A method for redirecting memory transactions in an associative memory having n ways, the method comprising:

sending a request to each of said ways to search an indexed location for a given tag, wherein said given tag and an index used to denote said indexed location form a memory address;

responsive to said request, generating a set of validity values to said n ways, each validity value indicating, for a respective way, whether said indexed location is a valid location or a defective location; and updating a set of access values corresponding to said indexed location, wherein said updating uses said set of n validity values to characterize a defective one of said corresponding locations as being recently used to prevent access to said defective one of said locations.

16. The method according to claim 15, further comprising searching said indexed locations for a match to said given tag by searching ones of the indexed locations characterized as defective and ones of the indexed locations not characterized as defective.

17. The method according to claim 15, further comprising testing said associative memory for defects and storing a first result of said testing in non-volatile storage, wherein said first result is used to create said set of validity values.

18. The method according to claim 17, further comprising:
testing a data memory that is associated with said associative memory for errors to produce a second result; and
combining said first result and said second result to form combined results, wherein said combined results are used to create said set of validity values.

19. The method according to claim 15, further comprising performing error correction for each way, wherein when a validity value indicates a defective location, a report of an error for said defective location is blocked.

20. The method according to claim 15, wherein a hit is reported for a given way if (a) one of said indexed locations contains a match for said tag, (b) a valid data bit for said one of said indexed locations given location is set or (c) said validity value indicates no defect.

* * * * *